(12) United States Patent
Liu et al.

(10) Patent No.: US 8,421,549 B2
(45) Date of Patent: Apr. 16, 2013

(54) IMPEDANCE MATCHING COMPONENT

(75) Inventors: Ruopeng Liu, Guangdong (CN); Guanxiong Xu, Guangdong (CN); Lin Luan, Guangdong (CN); Chunlin Ji, Guangdong (CN); Zhiya Zhao, Guangdong (CN); Nenghui Fang, Guangdong (CN)

(73) Assignees: Kuang-Chi Institute of Advanced Technology, Nanshan District, Shenzhen, Guangdong; Kuang-Chi Innovative Technology Ltd., Shenzhen, Guangdong ( * ) Notice: Subject to any disclaimer, the term of this patent is extended or adjusted under 35 U.S.C. 154(b) by 0 days.

(21) Appl. No.: 13/522,335

(22) PCT Filed: Nov. 18, 2011

(86) PCT No.: PCT/CN2011/082483
§ 371 (c)(1),
(2), (4) Date: Jul. 16, 2012

(87) PCT Pub. No.: WO2012/126250
PCT Pub. Date: Sep. 27, 2012

(65) Prior Publication Data
US 2012/0280761 A1 Nov. 8, 2012

(30) Foreign Application Priority Data
Mar. 18, 2011 (CN) .......................... 2011 1 0066476

(51) Int. Cl.
*H03H 7/38* (2006.01)

(52) U.S. Cl.
USPC .......................................................... 333/32

(58) Field of Classification Search ............ 333/32, 333/33, 34, 35
See application file for complete search history.

(56) References Cited

U.S. PATENT DOCUMENTS

| 7,538,946 B2* | 5/2009 | Smith et al. .................. 359/569 |
| 2012/0326800 A1* | 12/2012 | Liu et al. ......................... 333/32 |
| 2013/0002509 A1* | 1/2013 | Liu et al. ....................... 343/860 |

* cited by examiner

*Primary Examiner* — Stephen Jones
(74) *Attorney, Agent, or Firm* — Winston Hsu; Scott Margo

(57) ABSTRACT

The present disclosure discloses an impedance matching component disposed between a first medium and a second medium, which is formed by stacking a plurality of homogeneous metamaterial sheet layers in a direction perpendicular to surfaces thereof. Each of the metamaterial sheet layers comprises a substrate and a plurality of man-made microstructures attached thereon. A first and last metamaterial sheet layers have impedances identical to those of the first and second media respectively. The man-made microstructures attached on the first metamaterial sheet layer have a first pattern, the man-made microstructures attached on the last metamaterial sheet layer have a second pattern, and the man-made microstructures attached on intermediate ones of the metamaterial sheet layers have patterns that are combinations of the first and second patterns, with the first pattern becoming smaller continuously and the second pattern becoming larger continuously in the stacking direction of the metamaterial sheet layers.

18 Claims, 5 Drawing Sheets

IMPEDANCE MATCHING COMPONENT

FIELD OF THE INVENTION

The present disclosure generally relates to the technical field of electromagnetic communication, and more particularly, to an impedance matching component made of a metamaterial.

BACKGROUND OF THE INVENTION

With continuous development of the science and technologies, the electromagnetic wave technologies have penetrated into various aspects of people's life gradually. An important property of electromagnetic waves is that they can propagate in any media or even in a vacuum. During propagation of an electromagnetic wave from a transmitting terminal to a receiving terminal, the energy loss has a direct impact on the propagation distance of the electromagnetic wave and on the signal transmission quality.

The electromagnetic wave suffers substantially no energy loss when propagating through a same medium. However, when the electromagnetic wave propagates through an interface between different media, partial reflection of the electromagnetic wave will occur. Usually, the larger the difference in electromagnetic parameters (e.g., the dielectric permittivity or the magnetic permeability) between the different media at two sides of the interface is, the more the reflection will be. Due to partial reflection of the electromagnetic wave, the electromagnetic wave will suffer an electromagnetic energy loss in the propagation direction, which has a serious impact on the propagation distance of the electromagnetic wave and on the signal transmission quality.

Accordingly, researches have been made on impedance matching in order to reduce signal reflection when the electromagnetic wave propagates through an interface between different Media. However, currently the researches on impedance matching during the electromagnetic wave transmission are still limited to be within circuits, and there is still no sophisticated technology directed to impedance matching during propagation of the electromagnetic wave in space.

SUMMARY OF THE INVENTION

An objective of the present disclosure is to provide an impedance matching component that can reduce the energy loss of an electromagnetic wave when propagating through an interface between different media.

To achieve the aforesaid objective, the present disclosure discloses an impedance matching component disposed between a first medium and a second medium. The impedance matching component is formed by stacking a plurality of metamaterial sheet layers parallel to each other in a direction perpendicular to surfaces of the metamaterial sheet layers. Each of the metamaterial sheet layers comprises a sheet substrate and a plurality of man-made microstructures attached on the sheet substrate. A first metamaterial sheet layer and a last metamaterial sheet layer have impedances identical to those of the first medium and the second medium respectively. The plurality of man-made microstructures attached on the first metamaterial sheet layer have a first pattern, the plurality of man-made microstructures attached on the last metamaterial sheet layer have a second pattern, and the plurality of man-made microstructures attached on intermediate ones of the metamaterial sheet layers have patterns that are combinations of the first pattern and the second pattern, with the first pattern becoming smaller continuously and the second pattern becoming larger continuously in the stacking direction of the metamaterial sheet layers.

Preferably, both the first medium and the second medium are homogeneous, and the impedance matching component is formed of the plurality of metamaterial sheet layers each having an uniform impedance arrangement.

Preferably, each of the man-made microstructures is a metal wire having a predetermined pattern and attached on the sheet substrate, and the metal wire is a copper wire or a silver wire.

Preferably, the metal wire is attached on the sheet substrate through etching, electroplating, drilling, photolithography, electron etching or ion etching.

Preferably, the sheet substrate is made of a ceramic material, an epoxy resin, PTFE, an FR-4 composite material or an F4B composite material.

Preferably, the man-made microstructures of the first metamaterial sheet layer and/or the last metamaterial sheet layer are of an axisymmetrical configuration.

Preferably, the first pattern is of an "I" form, an "H" form or an "圭" form that stands upright, and the second pattern is correspondingly of an "I" form, an "H" form or an "圭" form that is rotated by 90°.

To achieve the aforesaid objective, the present disclosure further discloses an impedance matching component disposed between a first medium and a second medium. The impedance matching component is formed by stacking a plurality of metamaterial sheet layers parallel to each other in a direction perpendicular to surfaces of the metamaterial sheet layers. Each of the metamaterial sheet layers comprises a sheet substrate and a plurality of man-made microstructures attached on the sheet substrate. Each of the man-made microstructures is a metal wire having a predetermined pattern and attached on the sheet substrate. A first metamaterial sheet layer and a last metamaterial sheet layer have impedances identical to those of the first medium and the second medium respectively. The plurality of man-made microstructures attached on the first metamaterial sheet layer have a first pattern, the plurality of man-made microstructures attached on the last metamaterial sheet layer have a second pattern, and the man-made microstructures attached on intermediate ones of the metamaterial sheet layers have patterns that are combinations of the first pattern and the second pattern, with the first pattern becoming smaller continuously and the second pattern becoming larger continuously in the stacking direction of the metamaterial sheet layers.

Preferably, the metal wire is a copper wire or a silver wire.

Preferably, both the first medium and the second medium are homogeneous, and the impedance matching component is formed of the plurality of metamaterial sheet layers each having an uniform impedance arrangement.

Preferably, the sheet substrate is made of a ceramic material, an epoxy resin, PTFE, an FR-4 composite material or an F4B composite material.

Preferably, the man-made microstructures of the first metamaterial sheet layer and/or the last metamaterial sheet layer are of an axisymmetrical configuration.

Preferably, the metal wire is attached on the sheet substrate through etching, electroplating, drilling, photolithography, electron etching or ion etching.

Preferably, the sheet substrate is made of a ceramic material, an epoxy resin, PTFE, an FR-4 composite material or an F4B composite material.

Preferably, the man-made microstructures of the first metamaterial sheet layer and/or the last metamaterial sheet layer are of an axisymmetrical configuration.

Preferably, the first pattern is of an "I" form, an "H" form or an "圭" form that stands upright, and the second pattern is correspondingly of an "I" form, an "H" form or an "圭" form that is rotated by 90°.

The aforesaid technical solutions at least have the following benefits: in the impedance matching component according to embodiments of the present disclosure, a plurality of metamaterial sheet layers are stacked together to form impedance gradient layers, so disposing the impedance matching component between two media can avoid an abrupt change in impedance between the two media. Thereby, the problem that an electromagnetic wave propagating through an interface between two different media suffers an energy loss due to reflection is solved.

DETAILED DESCRIPTION OF THE INVENTION

Figure 1:
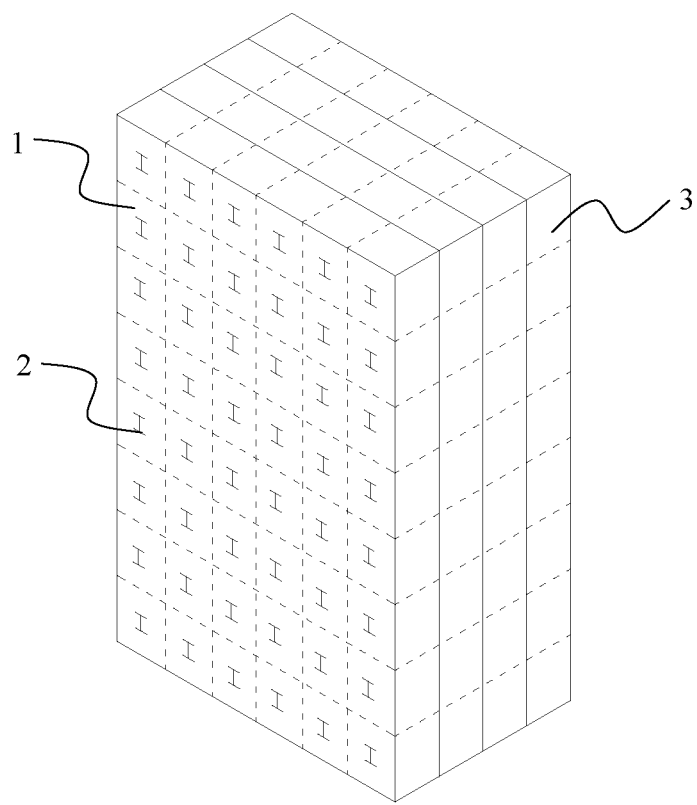
FIG. 1 is a schematic structural view of an embodiment of an impedance matching component according to the present disclosure.
Figure 2:
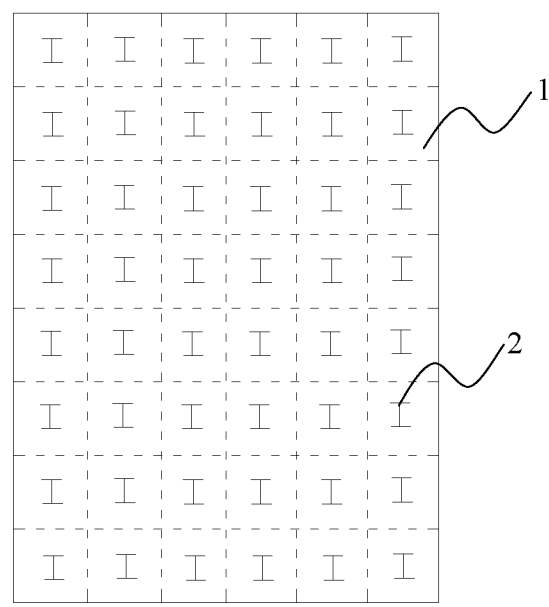
FIG. 2 is a front view of the impedance matching component shown in FIG. 1.
Figure 3:
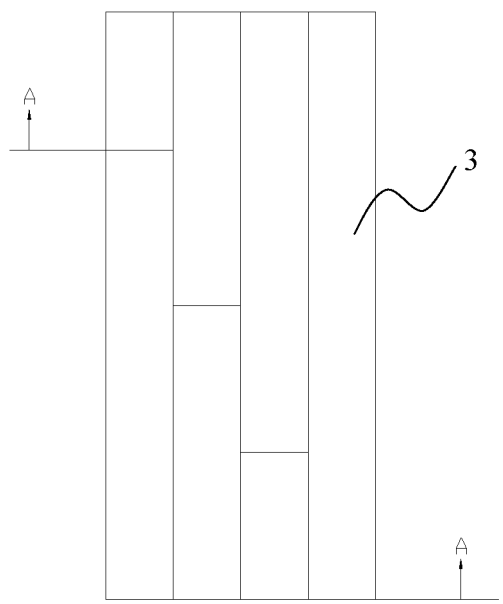
FIG. 3 is a side view of the impedance matching component shown in FIG. 1.
Figure 4:
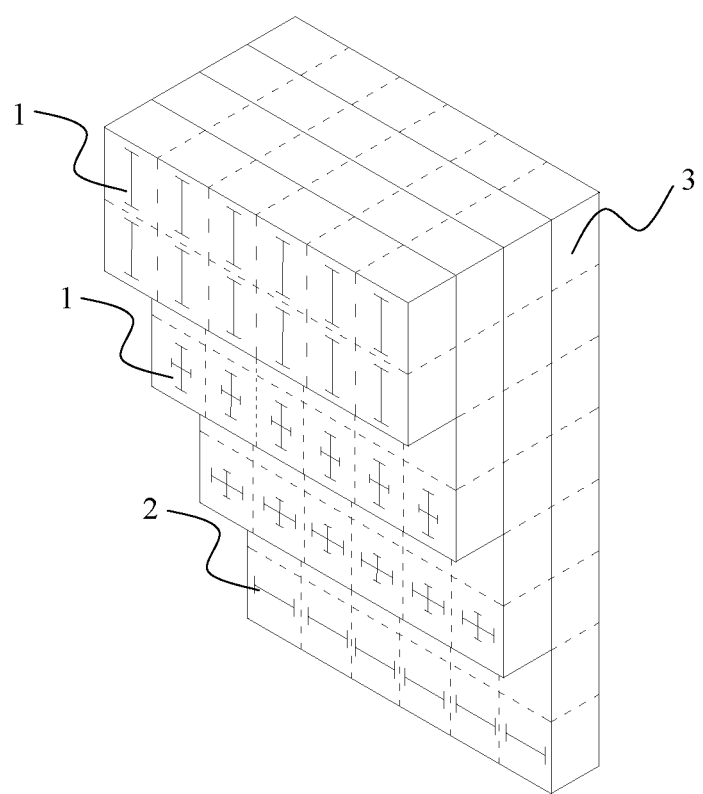
FIG. 4 is an A-A cross-sectional view of the impedance matching component shown in FIG. 3.

The electromagnetic wave suffers substantially no energy loss when propagating through a same medium. However, when the electromagnetic wave propagates through an interface between different media, partial reflection of the electromagnetic wave will occur. Usually, the larger the difference in electromagnetic parameters (e.g., the dielectric permittivity or the magnetic permeability) between the different media at two sides of the interface is, the more the reflection will be. Due to partial reflection of the electromagnetic wave, the electromagnetic wave will suffer an electromagnetic energy loss in the propagation direction, which has a serious impact on the propagation distance of the electromagnetic wave and on the signal transmission quality. The present disclosure relates to an impedance matching component made of a metamaterial, which can solve the problem that an electromagnetic wave propagating through an interface between two different media in the space suffers an energy loss due to partial reflection.

The metamaterial is a kind of novel material that is formed by man-made microstructures 2 as cell units arranged in the space in a particular manner and that has predetermined electromagnetic responses. A metamaterial comprises man-made microstructures 2 formed of metal wires having predetermined patterns and a substrate 1 on which the man-made microstructures 2 are attached. A plurality of man-made microstructures 2 are arranged in an array form on the substrate 1, with each of the man-made microstructures 2 and a portion of the substrate 1 occupied by the man-made microstructure 2 forming a cell. The substrate 1 may be made of any material different from that of the man-made microstructures 2, and use of the two different materials impart an equivalent dielectric permittivity and an equivalent magnetic permeability to each cell. The equivalent dielectric permittivity and the equivalent magnetic permeability correspond to a response to the electric field and a response to the magnetic field of the cell respectively. Because the metamaterial as a whole shall make a macroscopic electromagnetic response to an incident electromagnetic wave, the responses of the individual cells of the metamaterial to the incident electromagnetic wave must form a continuous response. This necessitates that each of the cells of the metamaterial has a dimension that is one tenth to one fifth, and preferably one tenth of a wavelength of the incident electromagnetic wave. The electromagnetic response of the metamaterial is determined by properties of the man-made microstructures 2, and the electromagnetic response of the man-made microstructures 2 is largely determined by the topologies and the geometric dimensions of the patterns of their metal wires.

By designing the pattern and the geometric dimensions of each of the man-made microstructures 2 arranged in the space of the metamaterial according to the aforesaid principle, the electromagnetic parameters at each point of the metamaterial can be set. Because the impedance is directly proportional to $\sqrt{\mu/\epsilon}$ the impedance can be changed by changing one or both of the dielectric permittivity and the magnetic permeability. Therefore, a metamaterial can be used to produce an impedance matching component with graded impedances in such a way that an impedance at one side is identical to that of a first medium and an impedance at the other side is identical to that of a second medium while impedances between the two sides have gradual changes. Thus, the abrupt change in impedance between the first medium and the second medium can be eliminated so that reflection and energy loss of the electromagnetic wave when propagating an interface between the two different media can be avoided.

FIG. 1 to FIG. 4 are respectively a schematic structural view, a front view, a side view and an A-A cross-sectional view of an embodiment of an impedance matching component 10 (shown in FIG. 5) according to the present disclosure. In this embodiment, both the first medium and the second medium are homogeneous. The impedance matching component 10 is formed by stacking a plurality of homogeneous metamaterial sheet layers 3 together in a direction perpendicular to surfaces of the metamaterial sheet layers 3. Each of the metamaterial sheet layers 3 comprises a sheet substrate 1 and a plurality of man-made microstructures 2 attached on the sheet substrate 1. The first metamaterial sheet layer 3 and the last metamaterial sheet layer 3 have impedances identical to those of the first medium and the second medium respectively. A plurality of man-made microstructures 3 having a first pattern are attached on the first metamaterial sheet layer 3, and a plurality of man-made microstructures 2 having a second pattern are attached on the last metamaterial sheet layer 3. The man-made microstructures 2 attached on intermediate ones of the metamaterial sheet layers 3 have patterns that are combinations of the first pattern and the second pattern, with the first pattern becoming smaller continuously and the second pattern becoming larger continuously in the stacking direction of the metamaterial sheet layers.

Each of the man-made microstructures 2 is a metal wire having a predetermined pattern and attached on the sheet substrate 1. The metal wire is attached on the sheet substrate 1 through etching, electroplating, drilling, photolithography, electron etching or ion etching, among which the etching is preferred. In the etching process, a metal foil is attached on the sheet substrate 1 as a whole after an appropriate two-dimensional (2D) pattern of each of the man-made microstructures 2 has been designed; then, by use of an etching apparatus, portions of the foil other than the preset patterns of the man-made microstructures 2 are removed through a chemical reaction between a solution and the metal material.

Then, what is left is just the man-made microstructures 2 arranged in an array. The metal foil may be made of a metal material such as copper or silver. The sheet substrate 1 is made of a ceramic material, an epoxy resin, polytetrafluoroethene (PTFE), an FR-4 composite material or an F4B composite material.

In this embodiment, the man-made microstructure 2 of the first metamaterial sheet layer 3 is of an "I" form, which includes a first metal wire that is vertical and two second metal wires connected at two ends of the first metal wire respectively and perpendicular to the first metal wire. The man-made microstructure 2 of the last metamaterial sheet layer 3 is of an "H" form, which includes a third metal wire that is horizontal and two fourth metal wires connected at two ends of the third metal wire respectively and perpendicular to the third metal wire. Patterns of the man-made microstructures 2 of intermediate ones of the metamaterial sheet layers 3 are combinations of the "I" form and the "H" form, with the "I" pattern becoming smaller continuously and the "H" pattern becoming larger continuously in the stacking direction of the metamaterial sheet layers to form intermediate gradient layers. In practical implementations, the first pattern may be of an "I" form, an "H" form or an "王" form that stands upright, and the second pattern may be correspondingly of an "I" form, an "H" form or an "王" form that is rotated by 90°. Of course, the man-made microstructures 2 of the first and the last metamaterial sheet layers may also each be a pattern that is not axisymmetrical, for example, a "J" form, a "C" form or a "ト" form.

Figure 5:
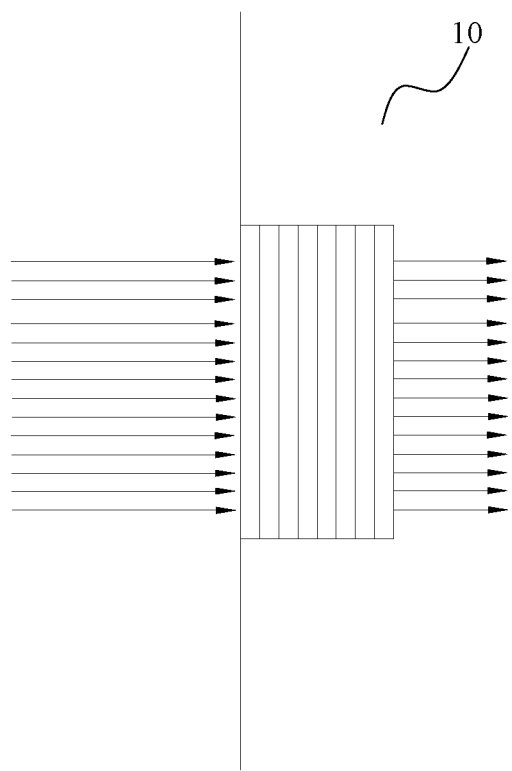
FIG. 5 is a schematic view illustrating an application of the impedance matching component according to an embodiment of the present disclosure.

FIG. 5 is a schematic view illustrating an application of the impedance matching component 10 of the present disclosure. The impedance matching component 10 of the present disclosure is disposed between two different media. The first pattern of the man-made microstructures 2 attached on the first metamaterial sheet layer 3 and the second pattern of the man-made microstructures 2 attached on the last metamaterial sheet layer 3 are designed according to the first medium and the second medium respectively. Patterns of the man-made microstructure 2 attached on intermediate ones of the metamaterial sheet layers 3 are combinations of the first pattern and the second pattern, with the first pattern becoming smaller continuously and the second pattern becoming larger continuously in the stacking direction of the metamaterial sheet layers 3 to form intermediate impedance gradient layers. Thus, impedance matching between the two different media is achieved.

What described above are just embodiments of the present disclosure. It shall be appreciated that, many improvements and modifications may be made by those of ordinary skill in the art without departing from the principle of the present disclosure, and these improvements and modifications shall also fall within the scope of the present disclosure.

What is claimed:

1. An impedance matching component disposed between a first medium and a second medium, wherein the impedance matching component is formed by stacking a plurality of metamaterial sheet layers parallel to each other in a direction perpendicular to surfaces of the metamaterial sheet layers, each of the metamaterial sheet layers comprises a sheet substrate and a plurality of man-made microstructures attached on the sheet substrate, a first metamaterial sheet layer and a last metamaterial sheet layer have impedances identical to those of the first medium and the second medium respectively, the plurality of man-made microstructures attached on the first metamaterial sheet layer have a first pattern, the plurality of man-made microstructures attached on the last metamaterial sheet layer have a second pattern, and the man-made microstructures attached on intermediate ones of the metamaterial sheet layers have patterns that are combinations of the first pattern and the second pattern, with the first pattern becoming smaller continuously and the second pattern becoming larger continuously in the stacking direction of the metamaterial sheet layers.

2. The impedance matching component of claim 1, wherein the sheet substrate is made of a ceramic material, an epoxy resin, PTFE, an FR-4 composite material or an F4B composite material.

3. The impedance matching component of claim 1, wherein each of the man-made microstructures is a metal wire having a predetermined pattern and attached on the sheet substrate, and the metal wire is a copper wire or a silver wire.

4. The impedance matching component of claim 3, wherein the metal wire is attached on the sheet substrate through etching, electroplating, drilling, photolithography, electron etching or ion etching.

5. The impedance matching component of claim 1, wherein the man-made microstructures of the first metamaterial sheet layer and/or the last metamaterial sheet layer are of an axisymmetrical configuration.

6. The impedance matching component of claim 5, wherein the first pattern is of an "I" form, an "H" form or an "王" form that stands upright, and the second pattern is correspondingly of an "I" form, an "H" form or an "王" form that is rotated by 90°.

7. The impedance matching component of claim 1, wherein both the first medium and the second medium are homogeneous, and the impedance matching component is formed of the plurality of metamaterial sheet layers each having an uniform impedance arrangement.

8. The impedance matching component of claim 7, wherein the sheet substrate is made of a ceramic material, an epoxy resin, polytetrafluoroethylene (PTFE), an FR-4 composite material or an F4B composite material.

9. The impedance matching component of claim 7, wherein the man-made microstructures of the first metamaterial sheet layer and/or the last metamaterial sheet layer are of an axisymmetrical configuration.

10. An impedance matching component disposed between a first medium and a second medium, wherein the impedance matching component is formed by stacking a plurality of metamaterial sheet layers parallel to each other in a direction perpendicular to surfaces of the metamaterial sheet layers, each of the metamaterial sheet layers comprises a sheet substrate and a plurality of man-made microstructures attached on the sheet substrate, each of the man-made microstructures is a metal wire having a predetermined pattern and attached on the sheet substrate, a first metamaterial sheet layer and a last metamaterial sheet layer have impedances identical to those of the first medium and the second medium respectively, the plurality of man-made microstructures attached on the first metamaterial sheet layer have a first pattern, the plurality of man-made microstructures attached on the last metamaterial sheet layer have a second pattern, and the man-made microstructures attached on intermediate ones of the metamaterial sheet layers have patterns that are combinations of the first pattern and the second pattern, with the first pattern becoming smaller continuously and the second pattern becoming larger continuously in the stacking direction of the metamaterial sheet layers.

11. The impedance matching component of claim 10, wherein the metal wire is a copper wire or a silver wire.

12. The impedance matching component of claim 10, wherein the metal wire is attached on the sheet substrate through etching, electroplating, drilling, photolithography, electron etching or ion etching.

13. The impedance matching component of claim 10, wherein the sheet substrate is made of a ceramic material, an epoxy resin, PTFE, an FR-4 composite material or an F4B composite material.

14. The impedance matching component of claim 10, wherein the man-made microstructures of the first metamaterial sheet layer and/or the last metamaterial sheet layer are of an axisymmetrical configuration.

15. The impedance matching component of claim 14, wherein the first pattern is of an "I" form, an "H" form or an "王" form that stands upright, and the second pattern is correspondingly of an "I" form, an "H" form or an "王" form that is rotated by 90°.

16. The impedance matching component of claim 10, wherein both the first medium and the second medium are homogeneous, and the impedance matching component is formed of the plurality of metamaterial sheet layers each having an uniform impedance arrangement.

17. The impedance matching component of claim 16, wherein the sheet substrate is made of a ceramic material, an epoxy resin, PTFE, an FR-4 composite material or an F4B composite material.

18. The impedance matching component of claim 16, wherein the man-made microstructures of the first metamaterial sheet layer and/or the last metamaterial sheet layer are of an axisymmetrical configuration.

\* \* \* \* \*